US009105801B2

(12) United States Patent
Lin et al.

(10) Patent No.: US 9,105,801 B2
(45) Date of Patent: *Aug. 11, 2015

(54) METHOD FOR FABRICATING CU—IN—GA—SE FILM SOLAR CELL

(71) Applicants: Liuyu Lin, New Taipei (CN); Zhun Zhang, New Taipei (CN)

(72) Inventors: Liuyu Lin, New Taipei (CN); Zhun Zhang, New Taipei (CN)

( * ) Notice: Subject to any disclaimer, the term of this patent is extended or adjusted under 35 U.S.C. 154(b) by 5 days.

This patent is subject to a terminal disclaimer.

(21) Appl. No.: 14/153,028

(22) Filed: Jan. 11, 2014

(65) Prior Publication Data
US 2014/0193943 A1   Jul. 10, 2014

Related U.S. Application Data

(63) Continuation of application No. PCT/CN2013/074096, filed on Apr. 11, 2013.

(51) Int. Cl.
*H01L 31/18* (2006.01)
*C23C 14/34* (2006.01)
*C23C 14/56* (2006.01)
*H01L 31/032* (2006.01)
*H01L 21/02* (2006.01)
*C23C 14/06* (2006.01)
*C23C 14/58* (2006.01)

(52) U.S. Cl.
CPC .......... *H01L 31/18* (2013.01); *C23C 14/0623* (2013.01); *C23C 14/34* (2013.01); *C23C 14/568* (2013.01); *C23C 14/5806* (2013.01); *H01L 21/02491* (2013.01); *H01L 21/02568* (2013.01); *H01L 21/02631* (2013.01); *H01L 31/0322* (2013.01); *Y02E 10/541* (2013.01)

(58) Field of Classification Search
CPC ............ H01L 31/1864; H01L 31/0336; H01L 31/322; H01L 31/18; H01L 21/02485; H01L 21/02491; H01L 21/02568; H01L 21/02631; C23C 14/34; C23C 14/568; C23C 14/0623; Y02E 10/541
USPC .......................................................... 438/95
See application file for complete search history.

(56) References Cited

U.S. PATENT DOCUMENTS

| 8,044,477 | B1 * | 10/2011 | Zhong et al. | 257/442 |
| 8,586,457 | B1 * | 11/2013 | Liang et al. | 438/509 |
| 8,894,826 | B2 * | 11/2014 | Frantz et al. | 204/192.26 |
| 8,921,148 | B2 * | 12/2014 | Elowe et al. | 438/96 |
| 8,927,322 | B2 * | 1/2015 | Avachat et al. | 438/80 |

(Continued)

FOREIGN PATENT DOCUMENTS

CN    1865489 A      11/2006
CN    201648514 U    11/2010

(Continued)

*Primary Examiner* — Savitr Mulpuri

(57) ABSTRACT

A method for fabricating a Cu—In—Ga—Se film solar cell is provided. The method comprises: a) fabricating a molybdenum back electrode on a substrate; b) fabricating a Cu—In—Ga—Se absorbing layer on the back electrode by fractional sputtering in a plurality of sputter chambers; c) performing an annealing; d) fabricating an $In_2Se_3$ or ZnS buffer layer on the Cu—In—Ga—Se absorbing layer; e) fabricating an intrinsic zinc oxide high impedance layer on the $In_2Se_3$ or ZnS buffer layer; f) fabricating an indium tin oxide film low impedance layer on the intrinsic zinc oxide high impedance layer; g) fabricating an aluminum electrode on the indium tin oxide film low impedance layer.

8 Claims, 3 Drawing Sheets

(56) References Cited

U.S. PATENT DOCUMENTS

| | | | |
|---|---|---|---|
| 8,969,124 B2* | 3/2015 | Lin et al. | 438/95 |
| 2010/0059385 A1* | 3/2010 | Li | 205/84 |
| 2011/0100460 A1* | 5/2011 | Bryden et al. | 136/260 |
| 2011/0284372 A1* | 11/2011 | Hiramoto et al. | 204/298.13 |
| 2012/0217157 A1* | 8/2012 | Zhang et al. | 204/298.13 |
| 2013/0001078 A1* | 1/2013 | Zhang et al. | 204/298.13 |
| 2013/0164885 A1* | 6/2013 | Liang et al. | 438/95 |
| 2013/0309850 A1* | 11/2013 | Liang et al. | 438/509 |
| 2014/0034491 A1* | 2/2014 | Zhang et al. | 204/298.13 |
| 2014/0109966 A1* | 4/2014 | Min et al. | 136/262 |
| 2014/0113403 A1* | 4/2014 | Van Duren et al. | 438/95 |
| 2014/0124362 A1* | 5/2014 | Li | 204/228.7 |
| 2014/0290739 A1* | 10/2014 | Deguchi | 136/258 |

FOREIGN PATENT DOCUMENTS

| | | |
|---|---|---|
| CN | 102054897 A | 5/2011 |
| CN | 102751388 A | 10/2012 |

* cited by examiner

METHOD FOR FABRICATING CU—IN—GA—SE FILM SOLAR CELL

CROSS-REFERENCE TO RELATED APPLICATIONS

This application is a continuation of International Application No. PCT/CN2013/074096, filed on Apr. 11, 2013, which claims priority to Chinese Patent Application No. 201210249760.7, filed on Jul. 18, 2012, both of which are hereby incorporated by reference in their entireties.

TECHNICAL FIELD

The present disclosure relates to solar cell field, and more particularly to a method for fabricating a Cu—In—Ga—Se film solar cell.

BACKGROUND

Currently, in one aspect, the available energy on the earth is increasingly decreasing, in another aspect, a petrifaction fuel may generate an emission of carbon oxide and sulfur oxide to pollute the air and increase a greenhouse effect, thus leading to a worse global environment and an unusual climate. Therefore, a development of pollution-free, renewable energy sources has become a primary research subject. A pollution-free solar energy is one of the best options of renewable energy. A primary task of a development of the solar cell lies in a development of a material for converting the solar energy into an electric energy with high efficiency.

It is well known that a Cu—In—Ga—Se compound which has a chalcopyrite structure may be fabricated on a soft or rigid substrate as a material for solar energy generation. Such Cu—In—Ga—Se film solar cell has advantages of high stability and low cost. The Cu—In—Ga—Se compound which is a compound semiconductor with chalcopyrite structure is a direct bandgap material, which can absorb solar lights in a wide wave length range and has a characteristic of forming a p-n junction by self-adjusting its component. Thus, the Cu—In—Ga—Se compound is considered as one of the best materials of an absorbing layer of the solar cell. For example, Cu(InGa)Se$_2$ (referred to as CIGS) is a semiconductor material with a best light-absorbing capability up to now. A thickness of a CIGS absorbing layer is only 1-2 μm because of the high light-absorbing capability of CIGS. For a mass production, a power generation cost of CIGS is only 0.03 USD/Watt according to a rough estimation, and thus, it is of a competitive edge. It is hopeful that a cost of the solar energy generation is equal to or even lower than that of the conventional petrifaction fuel power generation. Therefore, how to fabricate the Cu—In—Ga—Se film solar cell with low cost and high efficiency has become a research focus.

A CIGS film solar cell has following two advantages: (1) A photoelectricity conversion layer is as thin as a few micrometers. (2) A bandgap (forbidden bands) of Cu—In—Ga—Se compound may be adjusted by adjusting a content of Ga (gallium). According to a prior art, a relationship between a ratio of Ga to In and the bandgap (Eg) satisfies: $Eg(eV)=1.02+0.67y+0.11y(y-1)$, where $y=In/(Ga+In)$, which represents an atom content ratio. According to a theory, the solar energy is not maximally used by a solar cell with a single bandgap, that is, photon with low energy cannot generate any electron-hole pair, while photon with high energy can only excite one electron-hole pair, and the redundant energy is converted into a thermal energy unfavorable for the efficiency of the solar cell. To this end, it is desired for the solar cell to have more bandgaps to absorb more solar energy, thus improving the efficiency of the solar cell, which may be just achieved by CIGS with the characteristic of adjustable bandgap. The content of Ga may be adjusted when fabricating the CIGS film. The bandgap of the CIGS compound rises with an increase of the proportion of Ga.

Conventional methods for fabricating the CIGS film mainly comprise: (1) a selenylation method; (2) a laminating method; (3) a multi-source (such as two-source or three-source) evaporation method; (4) a sputtering method; (5) a deposition method; (6) a spray coating method; (7) a spinning coating method; (8) a vacuum heating synthesis method, etc. For the selenylation method, the laminating method, the multi-source evaporation method and the sputtering method, a sulfurization or selenylation process is required in certain step to treat the CIGS film. Sulfur atoms and selenium atoms may react with Cu—In—Ga through diffusion so as to generate a CuInGaSe compound. This process is called sulfurization or selenylation.

The selenylation method for fabricating the film solar cell with the chalcopyrite structure has following disadvantages of a long production period, a high energy consumption, a high consumption of selenium, a toxicity of a selenium vapor, a nonuniform distribution of selenium and a gradient distribution of selenium, etc.

In addition, it is difficult for the above methods to realize an adjustment of a gradient distribution of Ga by one-step. Taking a three-step co-evaporation method developed by an NREL Lab in United States for example, an A-shaped bandgap or a V-shaped bandgap is formed by different elements participation in three steps. The process is very complicated, and a precise real time control is also required. Although the film solar cell with a high conversion efficiency may be fabricated by this method, the method is not favorable for a mass production with a low cost and big area.

SUMMARY

In an aspect, a method for fabricating a Cu—In—Ga—Se film solar cell is provided. The method comprises:

a) fabricating a molybdenum back electrode on a substrate;

b) fabricating a Cu—In—Ga—Se absorbing layer on the molybdenum back electrode by a multi-step sputtering, in which the Cu—In—Ga—Se absorbing layer is fabricated by a sputter equipment, comprising: an input stage, an input chamber, a first to $N_{th}$ sputtering chambers, an unloading chamber and an unloading stage, the N sputtering chambers are connected in series, an internal volume of the input chamber is less than or equal to an internal volume of each sputtering chamber, an internal volume of the unloading chamber is less than or equal to the internal volume of each sputtering chamber, a vacuum of a first sputtering chamber is not destroyed when the substrate is transmitted from the input chamber into the first sputtering chamber, a vacuum of the last sputtering chamber is not destroyed when the substrate is transmitted from the last sputtering chamber to the unloading chamber, a $CuIn_xGa_{1-x}Se_2$ alloy target is mounted in each sputtering chamber, a sputtering with any power density ranging from 2 W/cm$^2$ to 3 W/cm$^2$ is performed with each $CuIn_xGa_{1-x}Se_2$ alloy target for 1-2 minutes, a working pressure of each sputtering chamber is $1\times10^{-4}$ Torr, and a temperature of the substrate in the sputtering chamber is maintained at any temperature between 200° C. and 450° C.;

c) performing an annealing for the Cu—In—Ga—Se absorbing layer in a rapid heating mode in the unloading chamber under a temperature of 400-600° C. for 55-90 seconds so that a Ga concentration in the Cu—In—Ga—Se absorbing layer has a gradient, the Ga concentration has a maximum on a surface of the Cu—In—Ga—Se absorbing layer contacting with the molybdenum back electrode and has a minimum on the other surface of the Cu—In—Ga—Se absorbing layer;

d) fabricating an $In_2Se_3$ or ZnS buffer layer with a thickness of 80-120 nm on the Cu—In—Ga—Se absorbing layer;

e) fabricating an intrinsic zinc oxide high impedance layer with a thickness of 0.1-0.5 μm on the $In_2Se_3$ or ZnS buffer layer;

f) fabricating an indium tin oxide film low impedance layer with a thickness of 0.3-0.8 μm on the intrinsic zinc oxide high impedance layer;

g) fabricating an aluminum electrode on the indium tin oxide film low impedance layer.

In one embodiment, a thickness of the Cu—In—Ga—Se absorbing layer ranges from 1.5 μm to 2 μm.

In one embodiment, in step b), N=5; for the $CuIn_xGa_{1-x}Se_2$ alloy target in the first sputtering chamber, x=0; for the $CuIn_xGa_{1-x}Se_2$ alloy target in a second sputtering chamber, 0.2<x<0.4; for the $CuIn_xGa_{1-x}Se_2$ alloy target in a third sputtering chamber, 0.4<x<0.6; for the $CuIn_xGa_{1-x}Se_2$ alloy target in a fourth sputtering chamber, 0.6<x<0.7; and for the $CuIn_xGa_{1-x}Se_2$ alloy target in a fifth sputtering chamber, x=0.7.

In one embodiment, in step d), the $In_2Se_3$ or ZnS buffer layer is fabricated by a vacuum magnetron sputtering with an $In_2Se_3$ alloy target or a ZnS alloy target under a working pressure of $1-5\times10^{-3}$ Torr in an Ar ambience, and the temperature of the substrate is maintained at a room temperature.

In one embodiment, in step e), the intrinsic zinc oxide high impedance layer is fabricated by a radio frequency vacuum magnetron sputtering with an intrinsic zinc oxide target under a working pressure of $1-5\times10^{-3}$ Torr with a working frequency of 400K-2 MHz in an Ar ambience, and the temperature of the substrate is maintained at a room temperature.

In one embodiment, in step f), the indium tin oxide film low impedance layer is fabricated by a vacuum direct current magnetron sputtering with an indium tin oxide target, in which a mass ratio of $In_2O_3$ to $SnO_2$ is 9:1, under a working pressure of $1-5\times10^{-3}$ Torr in an Ar ambience mixed with 2-5% $O_2$, and the temperature of the substrate is maintained at a room temperature.

In one embodiment, N=2, 3, 4, 6, 7 or 8.

In one embodiment, the gradient is a linear distribution.

With the method according to embodiments of the present disclosure, by using a non-selenylation process and forming the $In_2Se_3$ or ZnS buffer layer without cadmium, firstly, toxic gases such as $H_2Se$, $H_2S$ are not generated; secondly, a compound without cadmium is environmentally friendly and low cost; thirdly, a production equipment is simplified, an energy consumption is reduced and a production period is shortened.

Compared with a prior art, the method according to embodiments of the present disclosure has following advantages. All processes of the method are dry processes without using any chemical solvent or solution. The absorbing layer with a stable crystalline state is fabricated by one-step without additional selenylation or sulfurization process, thus greatly shortening the production period, reducing the production equipment, and preventing an environmental pollution as well as a potential danger during a production. In addition, the method has advantages of simple process, low energy consumption and low cost.

DESCRIPTION OF EMBODIMENTS

Various embodiments are described in detail below with reference to the drawings. Like reference numbers may be used to denote like parts throughout the figures.

Figure 1:
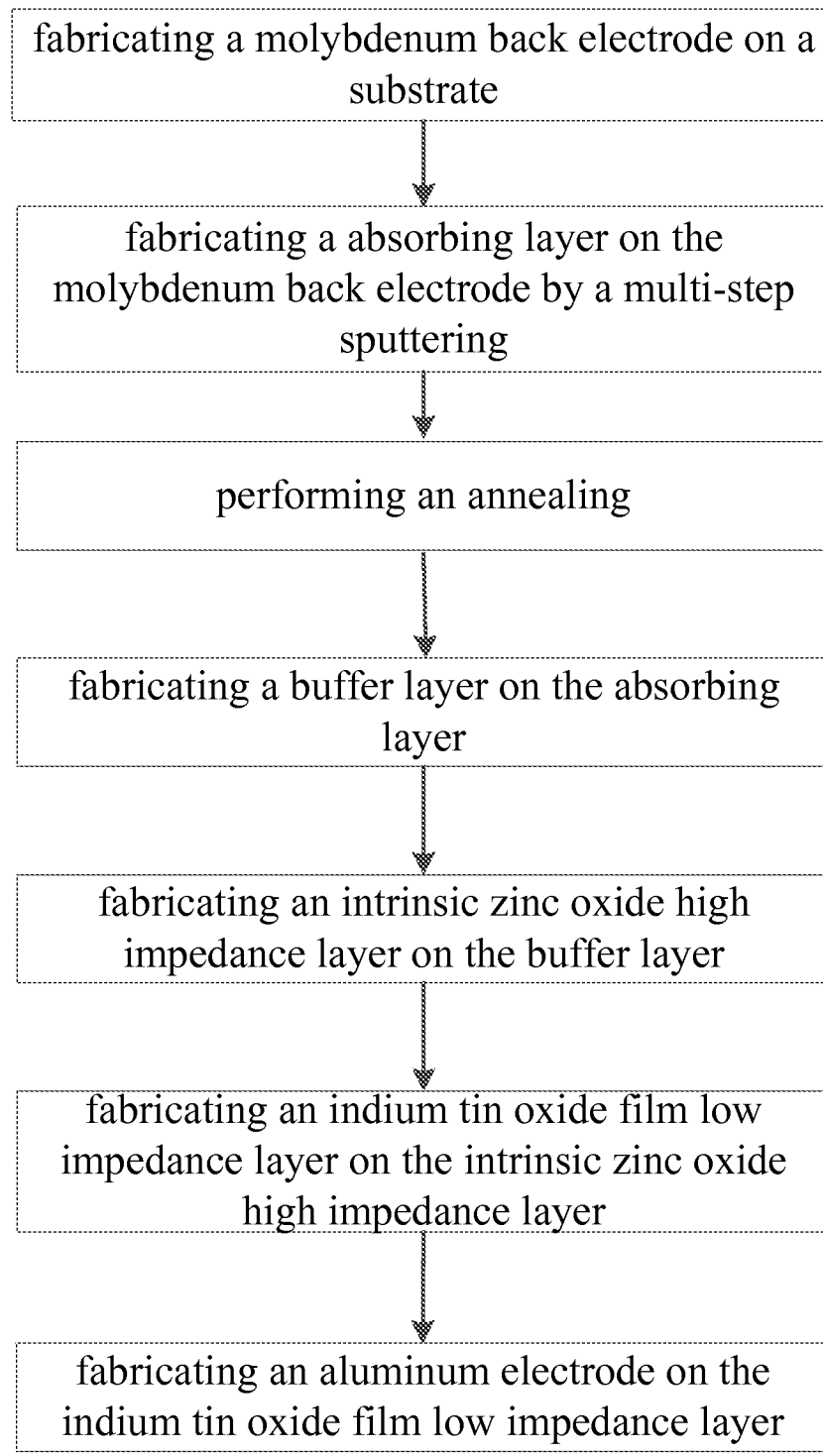
FIG. 1 is a flowchart illustrating a method for fabricating an absorbing layer of a Cu—In—Ga—Se film solar cell according to an embodiment of the present disclosure.

FIG. 1 is a flowchart illustrating a method for fabricating an absorbing layer of a Cu—In—Ga—Se film solar cell according to an embodiment of the present disclosure. As shown in FIG. 1, the method comprises following steps.

Firstly, a back electrode is fabricated on a substrate. The substrate may be a soda-lime glass substrate or a stainless steel sheet. Normally, the soda-lime glass substrate with a thickness of 1-3 mm or the stainless steel sheet with a thickness of 0.2 mm is preferred. In this embodiment, the back electrode is fabricated by depositing a molybdenum layer with a thickness of 0.8 μm using a magnetron sputtering.

Then, a Cu—In—Ga—Se absorbing layer is fabricated on the back electrode by a multi-step sputtering process. The Cu—In—Ga—Se absorbing layer is fabricated by a specific sputter equipment.

Figure 2:
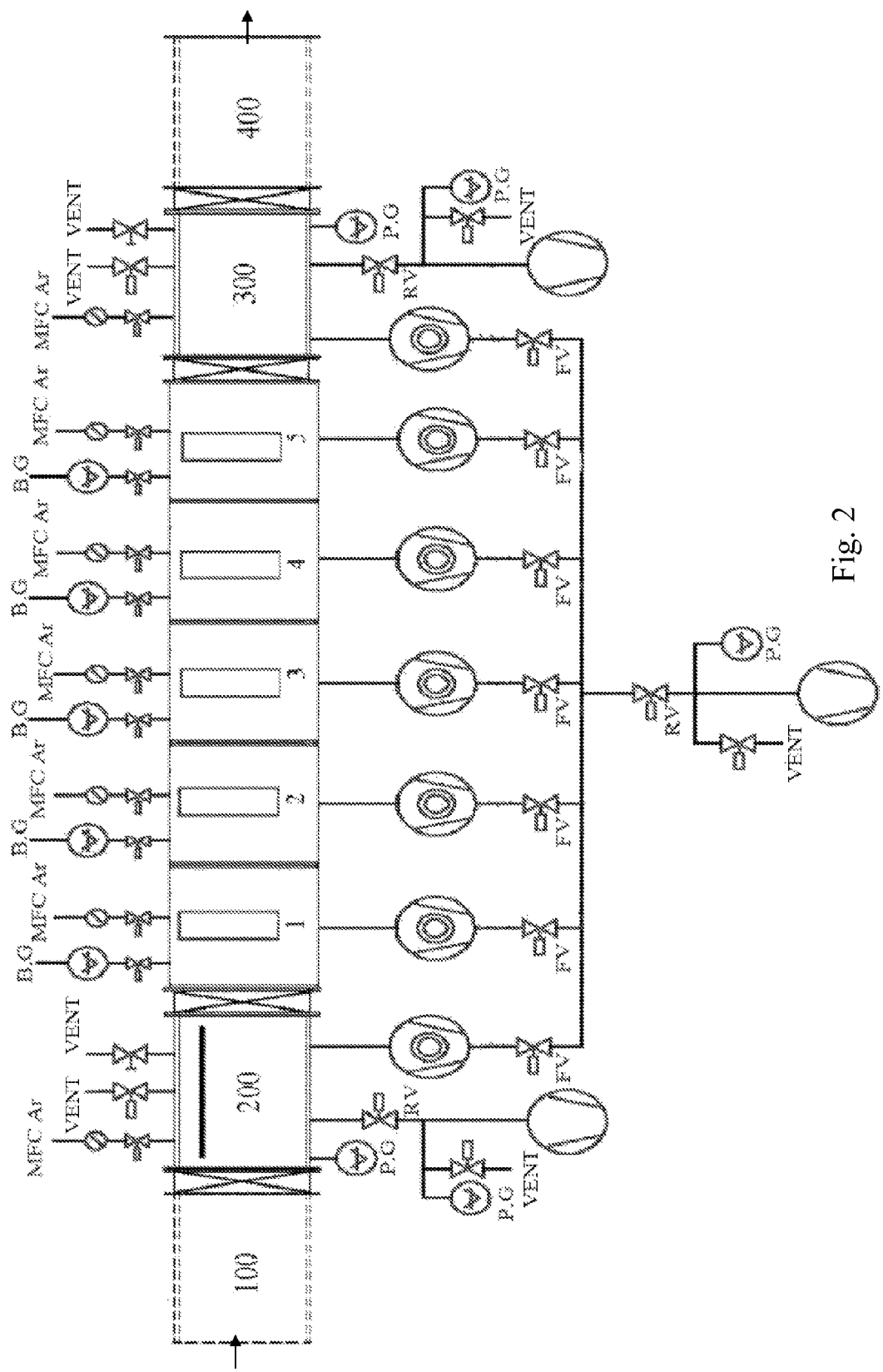
FIG. 2 is a schematic structural view of a sputter equipment for fabricating the absorbing layer according to an embodiment of the present disclosure.

FIG. 2 is a schematic structural view of the sputter equipment according to an embodiment of the present disclosure. As shown in FIG. 2, the sputter equipment comprises: an input stage 100, an input chamber 200, a sputtering chamber 1, a sputtering chamber 2, a sputtering chamber 3, a sputtering chamber 4, a sputtering chamber 5, an unloading chamber 300 and an unloading stage 400. In addition, the sputter equipment also comprises a transmitting mechanism for transmitting the substrates one by one from the input stage 100 to input chamber 200, then to each sputtering chamber, and finally to the unloading chamber 300. The input chamber 200 is disposed prior to the sputtering chamber 1 for performing a temperature processing (for example, a heating) and a vacuum pre-processing for the substrate to be sputtered. Because there is not any target and/or other element in the input chamber 200, an internal volume of the input chamber 200 may be designed relatively smaller. In one embodiment, the internal volume of the input chamber 200 is less than or equal to an internal volume of each sputtering chamber. A vacuum of the sputtering chamber 1 is not destroyed when the substrate is transmitted from the input chamber 200 into the sputtering chamber 1. A purpose of disposing the input chamber 200 as a buffer chamber lies in that the input chamber 200 takes the place of the sputtering chamber to be exposed in an atmospheric environment, to prevent the target in the sputtering chamber from contacting steam, impurity and dust in the atmosphere, thus improving a process quality.

A $CuIn_xGa_{1-x}Se_2$ (x=0) alloy target 1' is mounted in the sputtering chamber 1, and a sputtering with any power density ranging from 2 W/cm² to 3 W/cm² is performed with the alloy target 1' for 1-2 minutes. Then the substrate is transmitted to the sputtering chamber 2, where a $CuIn_xGa_{1-x}Se_2$ (0.2<x<0.4) alloy target 2' is mounted, and a sputtering with a power density ranging from 2 W/cm² to 3 W/cm² is performed with the alloy target 2' for 1-2 minutes. Then the substrate is transmitted to the sputtering chamber 3, where a $CuIn_xGa_{1-x}Se_2$ (0.4<x<0.6) alloy target 3' is mounted, and a sputtering with a power density ranging from 2 W/cm² to 3 W/cm² is performed with the alloy target 3' for 1-2 minutes. Then the substrate is transmitted to the sputtering chamber 4, where a $CuIn_xGa_{1-x}Se_2$ (0.6<x<0.7) alloy target 4' is mounted, and a sputtering with a power density ranging from 2 W/cm² to 3 W/cm² is performed with the alloy target 4' for 1-2 minutes. Then the substrate is transmitted to the sputtering chamber 5, where a $CuIn_xGa_{1-x}Se_2$ (x=0.7) alloy target 5' is mounted, and a sputtering with a power density ranging from 2 W/cm² to 3 W/cm² is performed with the alloy target 5' for 1-2 minutes. Finally, a thickness of the Cu—In—Ga—Se absorbing layer disposed on the molybdenum back electrode ranges from 1.5 μm to 2 μm. A working pressure of each sputtering chamber is $1 \times 10^{-4}$ Torr, and a temperature of the substrate is maintained at any temperature between 200° C. and 450° C. The sputtered substrate is transmitted to the unloading chamber. A purpose of the unloading chamber is similar with that of the input chamber 200, that is, a vacuum of the sputtering chamber 5 is not destroyed when the substrate is transmitted from the sputtering chamber 5 to the unloading chamber, and an annealing or other thermal processing may be performed in the unloading chamber 300. An internal volume of the unloading chamber 300 is less than or equal to the internal volume of each sputtering chamber. Then the substrate is transmitted to the unloading stage 400 to be collected in a substrate basket.

It should be noted that, in above embodiment, the five sputtering chambers are explanatory and illustrative, which are used to generally understand the present disclosure. According to practice, those skilled in the art may use 2-4 sputtering chambers, even more then 5, such as 6, 7 or 8 sputtering chambers. It can be understood that, when the number of the sputtering chambers is different and/or the thickness of the Cu—In—Ga—Se absorbing layer is different, accordingly, x of the $CuIn_xGa_{1-x}Se_2$ alloy target will be different.

Further, the unloading chamber 300 is vacuumized, and an annealing is performed for the Cu—In—Ga—Se absorbing layer in a rapid heating mode in the unloading chamber 300 under a temperature of 400-600° C. for 55-90 seconds. During the annealing process, it is not required to input any gas. During the annealing process, Ga ions diffuse from a high concentration part to a low concentration part so that the Ga concentration in the Cu—In—Ga—Se absorbing layer has agradient. The Ga concentration has a maximum on a surface of the Cu—In—Ga—Se absorbing layer contacting with the molybdenum back electrode, and has a minimum on the other surface of the Cu—In—Ga—Se absorbing layer. After the annealing, the Cu—In—Ga—Se absorbing layer has a chalcopyrite structure, and a local ions diffusion occurs because of thermal energy, thus improving a crystalline state of the absorbing layer as well as the photovoltaic power generation efficiency of the primary absorbing layer of the solar cell.

The annealing process will be explained in more details herein. During the sputtering process conducted through the sputtering chamber 1 to the sputtering chamber 5, when the substrate is transmitted from the sputtering chamber 1 to the sputtering chamber 2, the Ga concentration in the Cu—In—Ga—Se absorbing layer has a step gradient. After the substrate is transmitted from the sputtering chamber 2 to the sputtering chamber 3, from the sputtering chamber 3 to the sputtering chamber 4, and from the sputtering chamber 4 to the sputtering chamber 5, a plurality of step gradients are formed for the Ga concentration. Therefore, after the annealing, the Ga ions diffuse from a high concentration part to a low concentration part because of a thermal diffusion effect, and the step gradients gradually becomes unobvious and finally forms a linear gradient.

Thereafter, an $In_2Se_3$ or ZnS buffer layer is fabricated on the absorbing layer by a vacuum magnetron sputtering with an $In_2Se_3$ alloy target or a ZnS alloy target under a working pressure of $1-5 \times 10^{-3}$ Torr in an Ar ambience, and a temperature of the substrate is maintained at a room temperature. A thickness of the $In_2Se_3$ or ZnS buffer layer ranges from 80 nm to 120 nm.

Then, an intrinsic zinc oxide high impedance layer is fabricated on the buffer layer by a radio frequency vacuum magnetron sputtering with an intrinsic zinc oxide (ZnO) target under a working pressure of $1-5 \times 10^{-3}$ Torr with a working frequency of 400K-2 MHz in an Ar ambience, and a temperature of the substrate is maintained at a room temperature. A thickness of the buffer layer ranges from 0.1 μm to 0.5 μm.

Further, an indium tin oxide ($In_2O_3:SnO_2$) film low impedance layer is fabricated on the intrinsic zinc oxide high impedance layer by a vacuum direct current magnetron sputtering with an indium tin oxide target, in which a mass ratio of $In_2O_3$ to $SnO_2$ is 9:1, under a working pressure of $1-5 \times 10^{-3}$ Torr in an Ar ambience mixed with 2-5% $O_2$, and a temperature of the substrate is maintained at a room temperature. A thickness of the intrinsic zinc oxide low impedance layer ranges from 0.3 μm to 0.8 μm.

At last, an aluminum electrode is fabricated on the indium tin oxide film low impedance layer by a sputtering with an aluminum target. Finally, the Cu—In—Ga—Se film solar cell having a Ga concentration with gradient distribution is formed.

Figure 3:
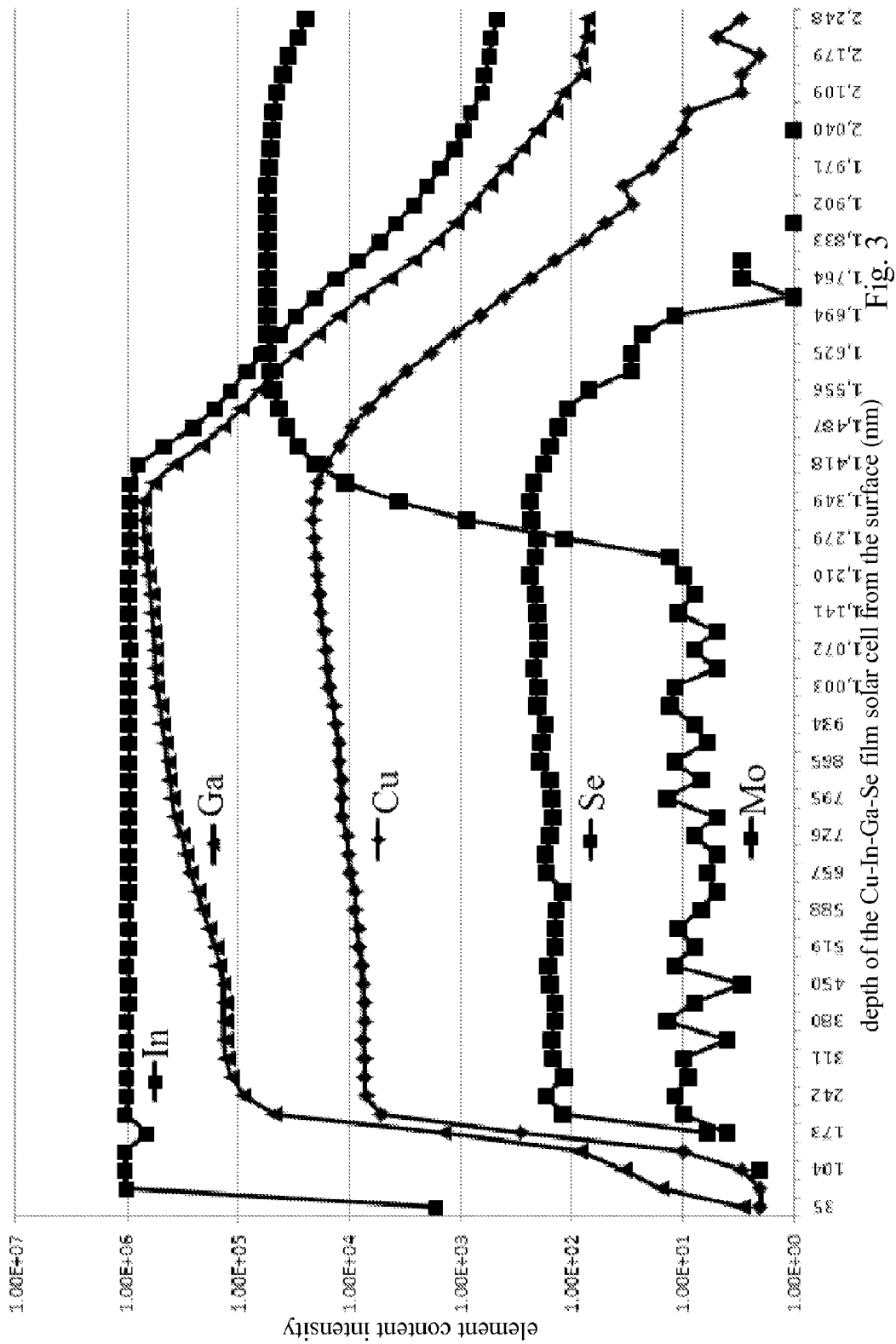
FIG. 3 is a secondary ion mass spectrum (SIMS) curve chart of the absorbing layer of the Cu—In—Ga—Se film solar cell fabricated by the method according to an embodiment of the present disclosure.

FIG. 3 is a secondary ion mass spectrum (SIMS) curve chart of the absorbing layer of the Cu—In—Ga—Se film solar cell fabricated according to the above method. It can be seen from FIG. 3 that the Ga concentration has a maximum on the surface of the Cu—In—Ga—Se absorbing layer contacting with the molybdenum back electrode and gradually decreases towards the other surface of the Cu—In—Ga—Se absorbing layer, which indicates that a bandgap of the absorbing layer has a gradient distribution.

Compared with a prior art, the method according to embodiments of the present disclosure has following advantages. All processes of the method are dry processes without using any chemical solvent or solution. The absorbing layer with a stable crystalline state is fabricated by one-step without additional selenylation or sulfurization process, thus greatly shortening a production period, reducing production equipment, and preventing an environmental pollution as well as a potential danger during a production. In addition, the method has advantages of simple process, low energy consumption and low cost.

All references cited in the description are hereby incorporated by reference in their entirety. While the disclosure has been described with respect to a limited number of embodiments, those skilled in the art, having benefit of this disclosure, will appreciate that other embodiments can be advised and achieved which do not depart from the scope of the description as disclosed herein.

The invention claimed is:

1. A method for fabricating a Cu—In—Ga—Se film solar cell, comprising:
  a) fabricating a molybdenum back electrode on a substrate;
  b) fabricating a Cu—In—Ga—Se absorbing layer on the molybdenum back electrode by a multi-step sputtering, wherein
    the Cu—In—Ga—Se absorbing layer is fabricated by a sputter equipment, comprising: an input stage, an input chamber, a first to $N_{th}$ sputtering chambers, an unloading chamber and an unloading stage, the N sputtering chambers are connected in series, an internal volume of the input chamber is less than or equal to an internal volume of each sputtering chamber, an internal volume of the unloading chamber is less than or equal to the internal volume of each sputtering chamber, a vacuum of a first sputtering chamber is not destroyed when the substrate is transmitted from the input chamber into the first sputtering chamber, a vacuum of the last sputtering chamber is not destroyed when the substrate is transmitted from the last sputtering chamber to the unloading chamber, a $CuIn_xGa_{1-x}Se_2$ alloy target is mounted in each sputtering chamber, a sputtering with any power density ranging from 2 W/cm$^2$ to 3 W/cm$^2$ is performed with each $CuIn_xGa_{1-x}Se_2$ alloy target for 1-2 minutes, a working pressure of each sputtering chamber is $1 \times 10^{-4}$ Torr, and a temperature of the substrate in the sputtering chamber is maintained at any temperature between 200° C. and 450° C.;

c) performing an annealing for the Cu—In—Ga—Se absorbing layer in a rapid heating mode in the unloading chamber under a temperature of 400-600° C. for 55-90 seconds so that a Ga concentration in the Cu—In—Ga—Se absorbing layer has a gradient, the Ga concentration has a maximum on a surface of the Cu—In—Ga—Se absorbing layer contacting with the molybdenum back electrode and has a minimum on the other surface of the Cu—In—Ga—Se absorbing layer;

d) fabricating an $In_2Se_3$ or ZnS buffer layer with a thickness of 80-120 nm on the Cu—In—Ga—Se absorbing layer;

e) fabricating an intrinsic zinc oxide high impedance layer with a thickness of 0.1-0.5 μm on the $In_2Se_3$ or ZnS buffer layer;

f) fabricating an indium tin oxide film low impedance layer with a thickness of 0.3-0.8 μm on the intrinsic zinc oxide high impedance layer;

g) fabricating an aluminum electrode on the indium tin oxide film low impedance layer.

2. The method of claim 1, wherein a thickness of the Cu—In—Ga—Se absorbing layer ranges from 1.5 μm to 2 μm.

3. The method of claim 1, wherein in step b),
N=5;
for the $CuIn_xGa_{1-x}Se_2$ alloy target in the first sputtering chamber, x=0;
for the $CuIn_xGa_{1-x}Se_2$ alloy target in a second sputtering chamber, 0.2<x<0.4;
for the $CuIn_xGa_{1-x}Se_2$ alloy target in a third sputtering chamber, 0.4<x<0.6;
for the $CuIn_xGa_{1-x}Se_2$ alloy target in a fourth sputtering chamber, 0.6<x<0.7; and
for the $CuIn_xGa_{1-x}Se_2$ alloy target in a fifth sputtering chamber, x=0.7.

4. The method of claim 1, wherein in step d), the $In_2Se_3$ or ZnS buffer layer is fabricated by a vacuum magnetron sputtering with an $In_2Se_3$ alloy target or a ZnS alloy target under a working pressure of $1-5 \times 10^{-3}$ Torr in an Ar ambience, and the temperature of the substrate is maintained at a room temperature.

5. The method of claim 1, wherein in step e), the intrinsic zinc oxide high impedance layer is fabricated by a radio frequency vacuum magnetron sputtering with an intrinsic zinc oxide target under a working pressure of $1-5 \times 10^{-3}$ Torr with a working frequency of 400K-2 MHz in an Ar ambience, and the temperature of the substrate is maintained at a room temperature.

6. The method of claim 1, wherein in step f), the indium tin oxide film low impedance layer is fabricated by a vacuum direct current magnetron sputtering with an indium tin oxide target, in which a mass ratio of $In_2O_3$ to $SnO_2$ is 9:1, under a working pressure of $1-5 \times 10^{-3}$ Torr in an Ar ambience mixed with 2-5% $O_2$, and the temperature of the substrate is maintained at a room temperature.

7. The method of claim 1, wherein N=2, 3, 4, 6, 7 or 8.

8. The method of claim 1, wherein the gradient is a linear distribution.

* * * * *